United States Patent [19]

Akrout et al.

[11] Patent Number: 5,023,841
[45] Date of Patent: Jun. 11, 1991

[54] DOUBLE STAGE SENSE AMPLIFIER FOR RANDOM ACCESS MEMORIES

[75] Inventors: Chekib Akrout, Ris Orangis; Pierre Coppens, Savigny-Le-Temple; Bernard Denis, Mennecy; Pierre-Yves Urena, Vence, all of France

[73] Assignee: International Business Machines Corporation, Armonk, N.Y.

[21] Appl. No.: 313,216

[22] Filed: Feb. 21, 1989

[30] Foreign Application Priority Data

Feb. 26, 1988 [EP] European Pat. Off. ........ 88480005.3

[51] Int. Cl.[5] .................. G11C 7/00; G11C 11/40; G11C 11/407
[52] U.S. Cl. .................................. 365/205; 365/207; 365/208; 365/189.01; 365/189.05; 307/530
[58] Field of Search ................ 307/530; 365/189.01, 365/189.05, 207, 205, 206, 208, 230.05; 189.04

[56] References Cited

U.S. PATENT DOCUMENTS

| | | | |
|---|---|---|---|
| 3,600,609 | 8/1971 | Christensen | 307/279 |
| 3,879,621 | 4/1975 | Cavaliere et al. | 307/279 |
| 4,193,127 | 3/1980 | Gersbach | 365/189.04 |
| 4,542,483 | 9/1985 | Procyk | 365/205 X |
| 4,555,777 | 11/1985 | Poteet | 365/205 |
| 4,616,342 | 10/1986 | Miyamoto | 365/190 |
| 4,656,371 | 4/1987 | Binet et al. | 307/530 X |
| 4,658,158 | 4/1987 | Chau et al. | 307/530 |
| 4,719,596 | 1/1988 | Bernstein et al. | 365/189.04 |
| 4,764,901 | 8/1988 | Sakurai | 365/189 |

FOREIGN PATENT DOCUMENTS 0170285 8/1984 European Pat. Off. .
8502314 12/1983 World Int. Prop. O. .

OTHER PUBLICATIONS

IEEE International Solid-State Circuits Conference, Feb. 22–24, 1984, New York, U.S.A., Minatao et al: "A 20ns 64K CMOS RAM", pp. 222, 223 & 343.

Primary Examiner—Alyssa H. Bowler
Attorney, Agent, or Firm—Charles W. Peterson, Jr.

[57] ABSTRACT

In combination with an electronic memory of the type having a plurality of memory cells (CA, . . . CN) connected between two bit lines (BLT, BLC) having inherent bit line capacitances (C1, C2), there is disclosed an improved sense amplifier (15) comprised of two stages. A first stage (16) includes a first clocked latch (5) having an enable device (T5), gated by a first control signal (SSA) and bit switches (T6, T7) connected between the common nodes (6, 7) of said first clocked latch and said bit lines, and gated by a bit switch control signal (BS) to provide an output signal on first data lines (DLT, DLC). A second stage (17) includes a second clocked latch (20) having an enable device (T24) gated by a second signal (SL) and data switches (T28, T29) connected between second data lines (DT, DC) at the same potential as data output nodes (21, 22) of said second clocked latch and said first data lines (DLT, DLC). Said data switches (T28, T29) are gated by a data switch control signal (DS) which is derived from the bit switch control signal (BS), so that the first and second stages (16, 17) operate sequentially to amplify the data continuously along the sensing chain of the data path during a READ operation to provide a data output signal on said data output nodes. The data is then available for further processing at the output terminal (24) of the output driver (23).

17 Claims, 4 Drawing Sheets

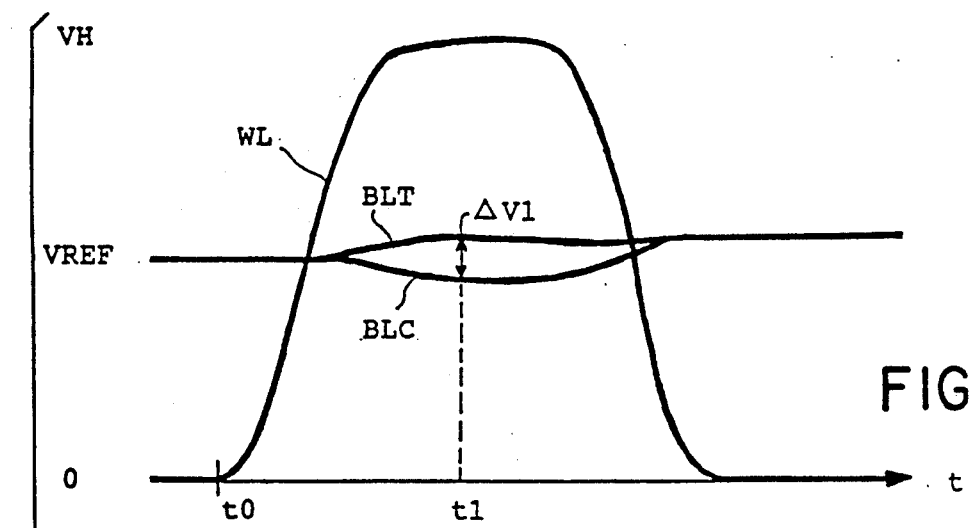
FIG. 4A
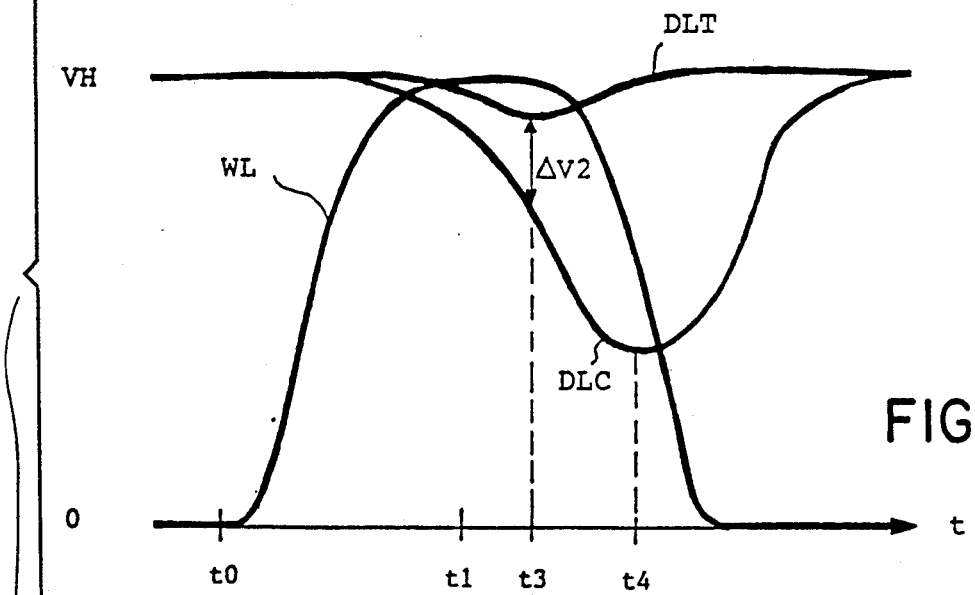
FIG. 4B
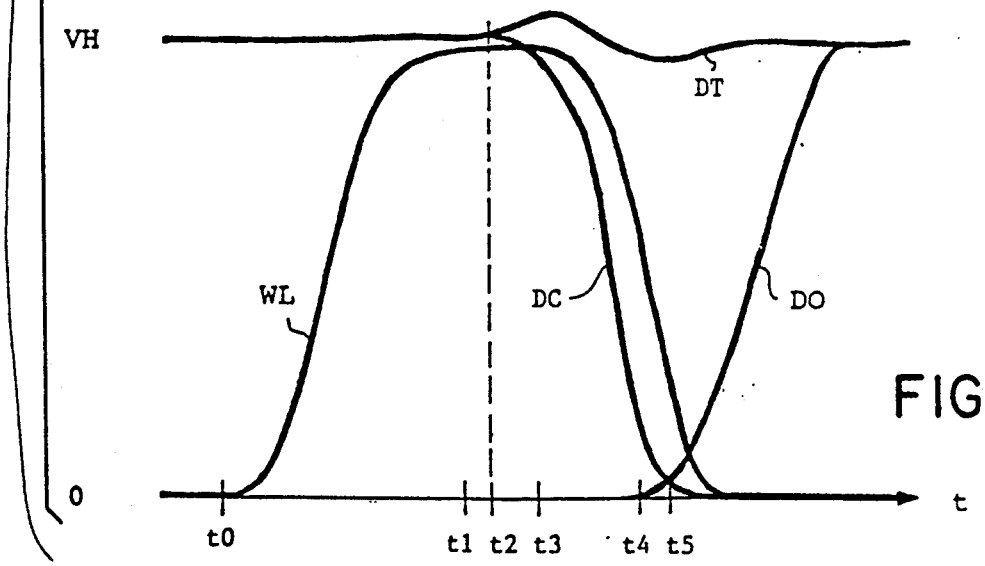
FIG. 4C
FIG. 4

DOUBLE STAGE SENSE AMPLIFIER FOR RANDOM ACCESS MEMORIES

DESCRIPTION

The present invention relates to Random Access Memories (RAMs) and more particularly to a double stage sense amplifier for reading data from the cells of such memories.

BACKGROUND OF THE INVENTION

In the design of a Random Access Memory, it is common practice to array a large number of memory cells in a matrix of rows and columns. Data is typically transferred to and from the memory cells of the same column by means of a pair of electrical conductors, often referred to as the column busses or bit lines. A specific cell among all of those connected between said pair of bit lines is selected by a signal applied to a row address, or word line, which enables all of the memory cells in a row.

The memory cells may be either of the static random access memory type (SRAMs) or of the dynamic random access memory type (DRAMs). In systems using SRAMs, data are usually stored in cross coupled transistor latches where one or more paths to ground can be selectively switched on or off. In DRAMs, data are stored in capacitors by the operation of one or more transistors. In accessing or reading the static type cells, it has heretofore been necessary to permit one of the bit lines to be discharged substantially to ground by currents passing through the memory cells in order to detect a logic "1" (or "0") stored in the cell. Because of the high capacitance of the bit line, this has resulted in a relatively long time period before the bit line is discharged sufficiently for valid data to be read from the cell. In systems using DRAMs, where cells require destructive read cycles, data is read from the memory cell by detecting a voltage pulse on the column bus as the capacitor of the memory cell is either charged or discharged when addressed. Because of the relatively small capacitance of the cells compared to the capacitance of the bit line, the voltage swing is usually small. Detecting the small voltage swing represents a serious problem in designing a sense amplifier circuit which functions reliably.

Generally speaking, as far as Random Access memories are concerned, whichever its type, the output or sensing of information on the bit lines is difficult because of the lack of a full swing logic level. On the other hand, short access times to stored data are particularly difficult to achieve in large scale MOSFET integrated circuits because of the capacitance of various nodes of the memory cells resulting from the manufacturing process.

There have been numerous patents which employ different techniques for providing a full logic output from the data received from the bit lines. For example, see U.S. Pat. No. 3,600,609 issued on Aug. 17, 1971 to Christensen wherein a pair of cross coupled IGFET devices are connected in a race mode and combined with IGFET inverters to convert the differential double rail output of an IGFET memory into a full logic level double rail data output. However, in the Christensen's reference, the "read" amplifier still tends to load the bit lines and does not isolate the bit lines when performing an output function. Additionally, it requires an additional stage of amplification to obtain a full logic output with appropriate levels.

According to U.S. Pat. No. 3,879,621 to J. R. Cavaliere and assigned to the assignee of the present invention, there is described a single stage FET sense amplifier for converting a double rail differential memory output signal into a full logic output signal. The amplifier comprises first and second pairs of FETs coupled together to a pair of common nodes, to form a standard latch. A fifth FET of a second type of conductivity connected to one of the pairs of FETs, is used as an enable device, controlled by a control clock signal. In a preferred embodiment, first and second FETs of the same conductivity type are connected to respective ones of the nodes to act as bit switches to provide good isolation between the bit lines and the latch. The first, second and third FETs are interconnected so that when the first and second transistors conduct, the third transistor is cut off, and vice versa.

So implemented, the disclosed sense amplifier is therefore capable of providing a full logic level output while isolating the bit lines of the memory during sensing. It is a good example of a modern high performance clocked sense amplifier well adapted to CMOS technology.

FIG. 1 of the present application describes the organization of a portion of a CMOS Static Random Access Memory circuit bearing reference 1, which utilizes such a single stage clocked sense amplifier provided with isolation means, to illustrate a typical example of the prior art known to the applicant.

The clocked sense amplifier 2 comprises first and second pairs 3 and 4 of cross coupled transistors. The first pair 3 includes two PFETs T1 and T2, and the second pair 4 includes two NFETs T3 and T4.

The source regions of transistors T1 and T2 are connected to the high voltage of a first power supply (VH) and source regions of transistors T3 and T4 are connected to the low voltage of a second power supply (GND), through an enabling device consisting of a NFET referenced T5, on the gate of which is applied a control clock signal SSA. The five devices T1 and T5 form a clocked latch indicated generally at 5.

Negligible impedance means interconnect the pairs of FETs. In the illustrated instance, the drains of T1 and T3, and the drains of T2 and T4 form nodes 6 and 7 respectively, where the output signal from a selected one of the nodes is available for amplification by the sense amplifier. These nodes 6 and 7 are connected to the inputs of an output latch or a buffer 8, the output of which is applied to an output driver 9. Nodes 6 and 7 are at the same potential as the data lines referenced DLT (Data Line True) and DLC (Data Line Complement), and will often be referred to as data out nodes, because the data is available there. Wires connecting said nodes to the output latch 8 are very short. The data out signal or data DO to be subsequently used for further processing is available on data out terminal 10.

Sense amplifier 2 also comprises means to isolate the clocked latch 5 and its related nodes 6 and 7, from the left or true bit line BLT and the right or complement bit line BLC, to permit said nodes to rise to full signal levels (full logic outputs), while not being loaded by bit lines. Said means consists of so called bit switches. NFETs T6 and T7 are used to that end, i.e., as bit switches to isolate nodes 6 and 7 from the bit lines BLT and BLC respectively, where desired. A control signal BS is applied on the gate electrodes of transistors T6 and T7.

A plurality of four transistor memory cells referenced CA to CN are connected to the bit lines BLT and BLC through two NFETs mounted in a transmission or transfer gate configuration and respectively referenced T8A to T8N and T9A to T9N to form an array 11. The gate electrodes of these FETs, e.g. T8A and T9A for cell CA, are connected to the corresponding word line, e.g. WLA, for READ and WRITE operations. Bit lines BLT and BLC are used as the input (WRITE) or output (READ) path for data movement in and out of the array portion.

Bit lines BLT and BLC are very capacitive due to the summation of all diffusions of transfer devices (T8A to T8N and T9A to T9N) and because long metal wires physically form these bit lines. Resulting capacitances of a column are illustrated in FIG. 1 by capacitors C1 and C2 respectively for BLT and BLC.

The stray capacitances of nodes 6 and 7 are represented by capacitors C3 and C4 and are kept as small as practical. Capacitances of the bit lines BLT and BLC, represented by capacitors C1 and C2 respectively, are inherently large when compared to capacitors C3 and C4.

Optionally, it should be recognized that additional memory cells, which are connected to other pairs of bit lines, may be also coupled to nodes 6 and 7 of the sense amplifier 2 through bus 13, so that one sense amplifier services more than one cell column. The amount F of additional columns may vary from 0 to a number P which depends on the technology used, the memory size and its organization. To date, up to $P=15$ bit line pairs may be connected to the represented bit line pair consisting of BLT and BLC. In other words a single sense amplifier such as represented in FIG. 1 may service up to 16 memory cell columns. This number P which represents the dotting capabilities of the circuit is limited by the speed of the sense amplifier, which is necessarily a low gain amplifier in the implementation o of FIG. 1. Of course, a separate clock control signal must be employed to permit appropriate gating into the nodes. Bit switches T6 and T7 are also used in cooperating to that purpose.

Finally, the memory circuit 1 also includes a restore circuit 12 for pulling up the potential of bit lines BLT and BLC to the reference voltage $VREF = VH - VT$ (VT being the threshold voltage of an NFET in a reference voltage generator not shown in FIG. 1). A suitable reference voltage generator is detailed in U.S. Pat. No. 4,914,634 (Improved Reference Voltage Generator for CMOS Memories, by C. Akrout, P. Coppens, B. Denis, and P. Urena) and assigned to the same assignee as of the present invention. Circuit 12 comprises three PFETs, T10, T11, and T12, gated by the bit line restore signal BLR. T10 and T11 are coupling transistors with the voltage reference generator. T12 equalizes the charge of capacitors C1 and C2 and therefore the potential of the bit lines. However, it is important to note that nodes 6 and 7 of latch 5 are not equalized. As a result, potentials of said nodes may have opposite binary values compared to the cell content to be accessed when a READ operation is initiated, therefore slowing it down.

The READ operation is as follows. Both bit lines BLT and BLC are charged to VREF. The particular cell is selected by raising the desired word line control signal WL to VH. The selected word line is maintained at this potential a sufficient time to discharge one of the bit lines by a predetermined amount. The clocked latch 5 is set, by bringing up the control clock signal SSA to VH, permitting a full swing logic output to be transmitted to the output latch 8. Clocked latch 5 has to be of the high gain type to ensure proper setting.

During such a READ operation, the sense amplifier 2 amplifies the differential voltage developed first between the bit lines BLT and BLC, and then between the data lines DLT and DLC. This memory organization is limited in speed as it requires the development of a large differential voltage between the sense amplifier internal nodes 6 and 7, i.e. between the two data lines. Moreover, because a full swing operation is needed in the sense amplifier 2, in order to supply the read data into the output latch 8, the access time is increased. In addition, the potentials of nodes 6 and 7 are not equalized, and may correspond to binary values opposite to the data being sensed on the bit lines when a memory cell is accessed. As a result, the setting of the clocked latch 5 has to be done later in order to be sure that the data has been correctly settled on the data lines. Finally, this READ operation is very power consuming when those nodes become highly capacitive with the growth of the memory size.

SUMMARY OF THE INVENTION

Accordingly, it is a primary object of this invention to provide an improved sense amplifier to be used in electronic memory circuits which overcomes the shortcomings encountered with the single stage sense amplifier and associated circuitry of the prior art.

It is another object of this invention to provide an improved sense amplifier circuit which can provide fast access time to the memory cell.

It is another object of this invention to provide an improved sense amplifier circuit which drastically reduces the consumed power.

It is another object of this invention to provide an improved sense amplifier circuit having a short cycle time.

It is a still further object of this invention to provide an improved sense amplifier circuit with increased dotting capabilities.

The present invention concerns a new high speed sensing scheme in electronic memories with superior performance.

According to a primary aspect of the invention, there is provided an improved sense amplifier for a memory circuit of the type including a plurality of memory cells connected between two bit lines. This improved sense amplifier is basically constructed to have a double stage structure. The first stage is a low gain amplifier. It includes a first clocked latch having an enable device gated by a first control signal and bit switches connected between the nodes of said first clocked latch and said bit lines; said bit switches are gated by a bit switch control signal to provide an output signal on first data lines. The second stage is a high gain amplifier. It includes a second clocked latch having an enable device gated by a second control signal and data switches connected between the nodes of said second clocked latch and said first data lines; said data switches are gated by data switch control signal to provide an output signal on second data lines at data output nodes.

Said data switch control signal is derived from the bit switch control signal so that first and second stages operate sequentially, to get the differential voltage developed between the bit lines, continuously amplified along the sensing chain. The second stage operates not only as a high gain amplifier but also as a buffer. The data output nodes are connected to an output driver, at the output of which, the data out signal or data DO is available.

According to another important aspect of the invention, writing means are provided to the first stage of the improved sense amplifier so that a WRITE operation in a selected cell is allowed through the first stage while a READ operation is finishing in the second stage which is isolated therefrom.

Briefly summarized, the invention may be described as the implementation of at least two successive toboggan-like stages in the sensing chain to decrease the amplification time. The use of such a double stage structure results in speeding up the data access, while full latching operation is performed at output level in the second stage. These at least two stages, are accessed sequentially in fast mode in order to get the differential voltage developed between the bit lines, continuously amplified and accelerated along the data lines of the sensing chain up to the output driver.

BRIEF DESCRIPTION OF THE DRAWINGS

The novel features believed characteristic of this invention are set forth in the appended claims. The invention itself, however, as well as other objects and advantages thereof, may best be understood by reference to the following detailed description, read in conjunction with the accompanying drawings in which:

FIGS. 4(a–c) show curves representing variations of the potentials on the bit lines, first data lines and second data lines (data out nodes) during a READ operation.

DETAILED DESCRIPTION OF THE INVENTION

Figure 2:
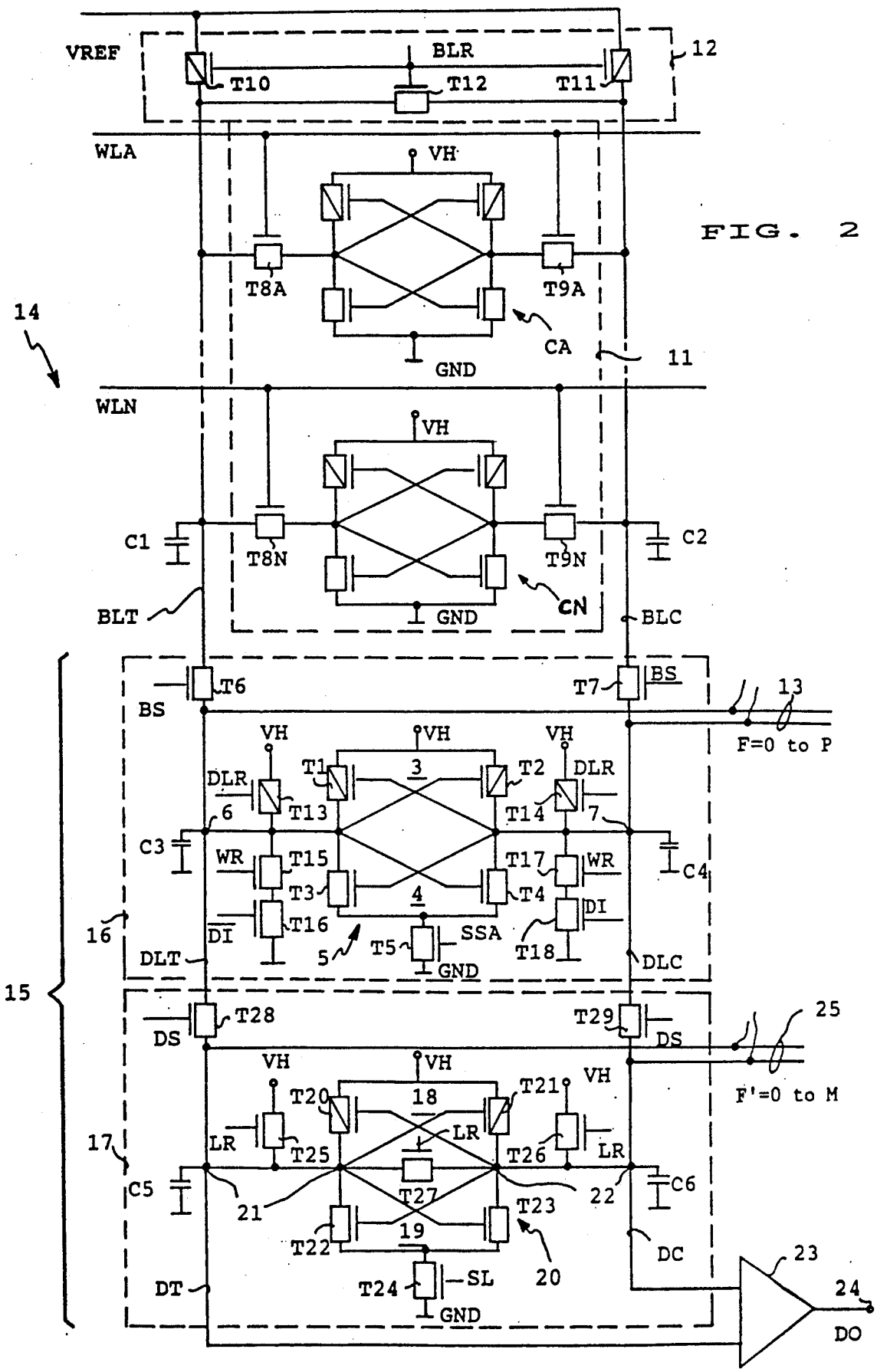
FIG. 2 is a schematic diagram of a portion of a static random access memory circuit utilizing a double stage sense amplifier in accordance with the present invention.

Referring now to FIG. 2, a typical memory organization, referenced 14, is shown using the double stage sense amplifier circuit of the present invention.

Figure 1:
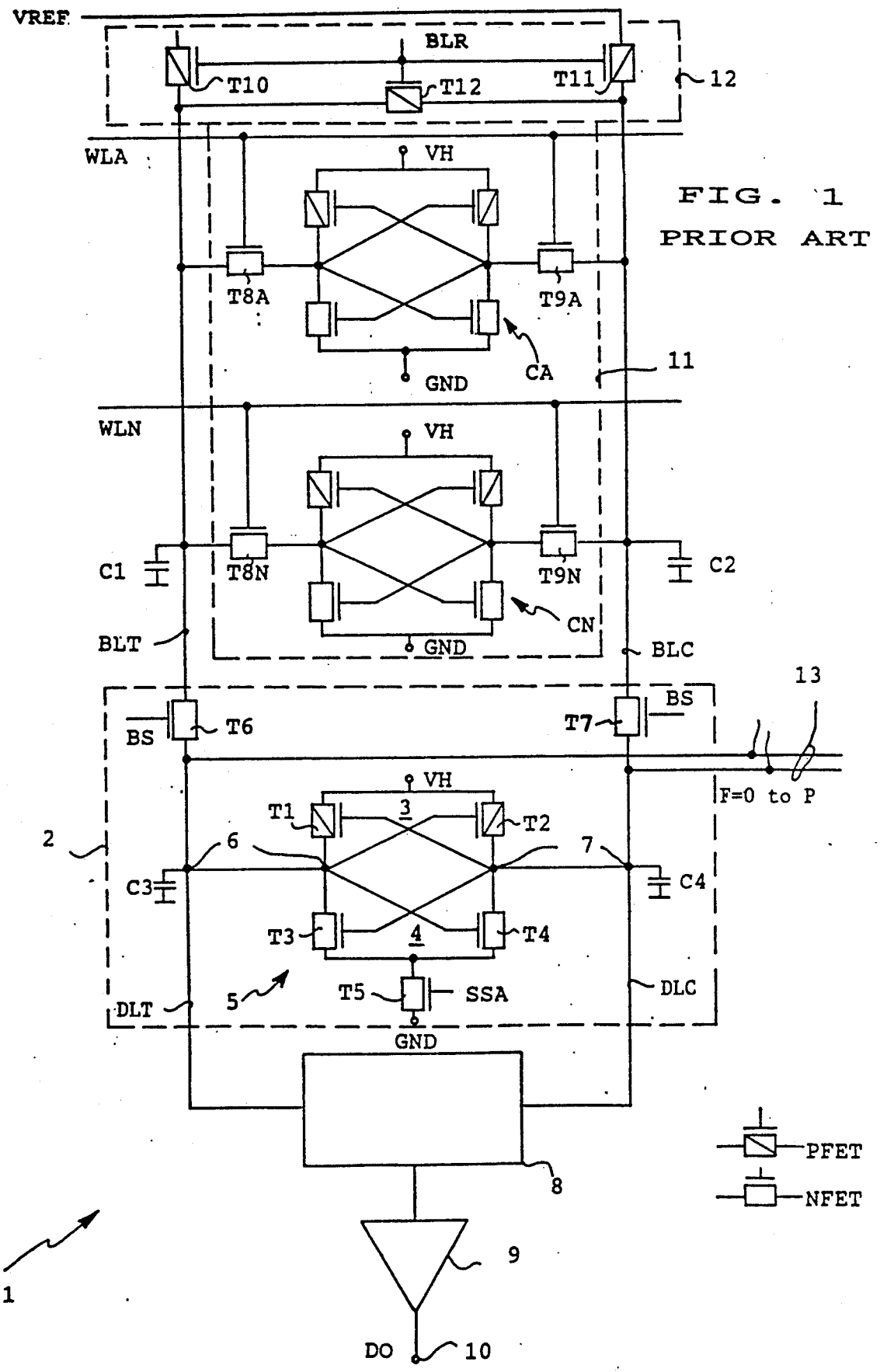
FIG. 1 is a schematic diagram of a portion of a static random access memory circuit according to the prior art.

Elements identical in FIGS. 1 and 2 bear the same references. The sense amplifier of the present invention is referenced 15. It is comprised of two stages 16 and 17. Describing first stage 16, two PFETs T13 and T14 gated by control signal DLR are respectively connected to nodes 6 and 7, so that when they conduct, the potential of the first data lines DLT and DLC is raised to VH. This allows a better restoration of said first data lines. In addition, to each of the nodes 6 and 7 is connected a pair of NFETs T15, T16 and T17, T18, respectively. T15 and T17 are gated by the WRITE control signal WR, while T16 and T18 are gated by the data input signals $\overline{DI}$ and DI respectively. These transistors will be used during a WRITE operation. It is to be noted that first stage 16 operates as a low gain amplifier connected at nodes 6 and 7 which are loaded by relatively small capacitors C3 and C4, and amplifies the small differential voltage developed on said capacitances.

Second stage 17 which is of a similar construction, first consists of two pairs of FETs 18 and 19, properly cross coupled to implement the latching function. The first pair 18 includes two PFETs T20 and T21, and the second pair 19 includes two NFETs T22 and T23. There is also provided an enabling device: a NFET T24, the gate electrode of which receives the set latch control signal SL. NFETs T20 to T24 form a clocked latch referenced 20. Nodes 21 and 22 of the clocked latch 20 are also the data output nodes of the second stage 17 and therefore also those the improved sense amplifier 15. These nodes are loaded by NFETs T25 and T26 gated by the latch restore control signal LR to restore second data lines referenced DT and DC to VH when desired. An additional transistor T27 equalizes the charge of capacitors C5 and C6. Note that a similar device could also be connected between nodes 6 and 7 of clocked latch 5. Transistors T13, T14 and T25, T26, T27 operate as restore and equalizing means to raise first and second pairs of data lines (and thus data output nodes) to VH at RESTORE. As a result, data lines are equalized and left floating until a READ/WRITE operation is initiated.

According to an important aspect of the invention, the array 11 and the first stage 16 (and therefore the capacitors C3 and C4 associated thereto at nodes 6 and 7), are all isolated from the second stage 17 by two switches, called data lines switches. These switches are implemented with two transfer NFETs T28 and T29, the gate electrodes of which receive the data switch control signal DS. This allows to set the first stage with a small differential voltage developed on small capacitors C3 and C4, and next to get a large differential voltage on the small capacitors C5 and C6 and finally to set said second stage operating as a high gain differential amplifier. First and second stages amplify the differential signal developed first across the bit line pair and then across the data line pairs, in other words all along the sensing chain which also may be considered as the data path of the memory circuit. It is an additional feature of the present invention to have the second stage operating not only as an amplifier but also as the output latch 8 of FIG. 1. The data is available on the data output nodes 21 and 22 which are at the same potential as the second pair of data lines DT and DC. The latter are connected to an output 23 and data out signal or data DO, to be used for subsequent processing, is available at data out terminal 24. Said output driver 23 may simply be constituted by two separate inverters, each connected to a data output node, so that, DO and $\overline{DO}$ are individually available, if a symmetrical output is required.

As explained above, up to P additional bit line pairs can be dotted on the bit line pair after the bit switches through bus 13. With the implementation shown in FIG. 2, number P can be higher when compared with implementation of FIG. 1. As an example, up to P=31 bit line pairs can be added, so that 32 cell columns may be serviced by first stage 16.

However, it is an important feature of the present invention to add further dotting capabilities. Through bus 25, a plurality (F'=0 to M) of cell columns, each provided with their first stage (16', 16", . . . ) can be dotted to the cell column depicted in FIG. 2. Practically, M may be as high as 3. Dotting is practically effected after the data switches as illustrated in FIG. 2. All the dotted cell columns are then serviced by a single second stage 17, common to all.

Circuit operation

Figure 3:
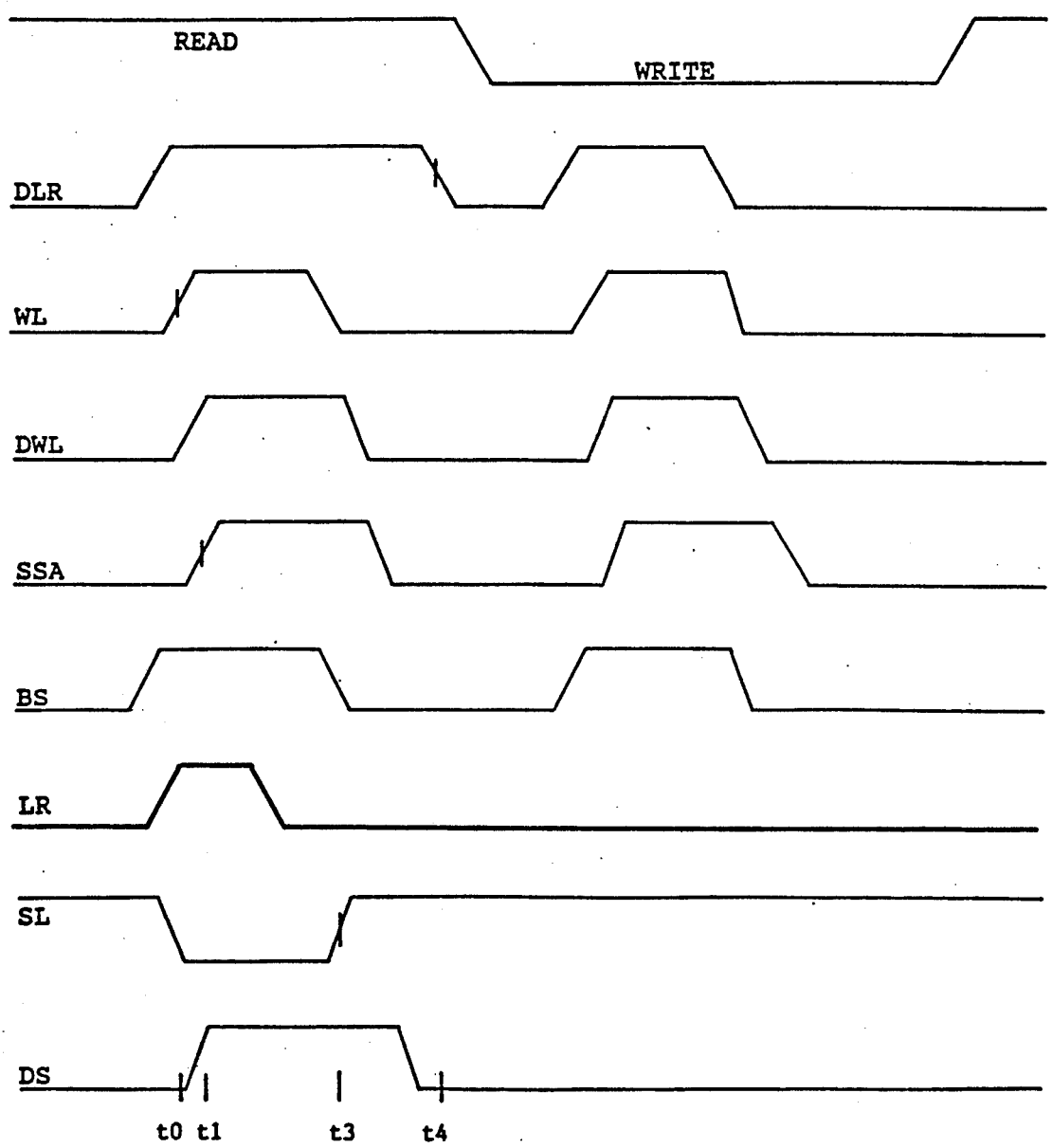
FIG. 3 is a timing chart used to explain the operation of the circuit shown in FIG. 2 during READ and WRITE operations.

The operation of circuit of FIG. 2 will now be explained in conjunction with the timing charts of FIG. 3.

During the RESTORE cycle, the BLR signal holds the bit lines at VREF=VH−VT, the DLR signal holds the first data lines high (VH) and the LR signal holds the second data lines high and equalized.

READ cycle

During a READ cycle, one word line, e.g. WLA, is driven high by raising the word line control signal WL to VH, to enable all the memory cells of a row. A differential voltage appears between the bit lines. Bit line switch transistors T6 and T7 are turned on by bit switch control signal BS. Capacitances of bit lines BLT and BLC and first data lines DLT and DLC, start their discharge into the selected cell. A small potential difference (e.g. 100 mv) appears between nodes 6 and 7 of the first stage 16 which is left floating. During this part of the discharge, data line switch transistors T28 and T29 remain off.

Setting of the first stage 16 of sense amplifier 15 is done with control signal SSA, generated from a Dummy Word Line DWL rising, ensuring proper capture of expected differential voltage drop. The DWL signal acts as a worst case of any WL rising. As the SSA signal rises high, first stage 16 is enabled and the differential voltage existing between nodes 6 and 7 is amplified and stored in the clocked latch 5.

Immediately after setting, data line switch transistors T28 and T29 are turned on by the DS signal (derived from BS signal), to transfer data to latch 20 of the second stage. Note that nodes 21 and 22 of latch 20 have been previously restored to VH and equalized through LR signal as explained above. In the very same manner as done with the first stage 16, latch 20 is floating because it is isolated from GND by T24 which is disabled by the SL signal. After RESTORE, those two nodes were left floating at VH level and are still floating at the time when data line switch transistors T28 and T29 are turned on.

At the opening of the data line switch transistors T28 and T29, a differential voltage appears promptly between nodes 21 and 22. At the appropriate time, latch 20 is set by SL signal (derived from SSA signal) which goes high, thus enabling latch 20 to store the data. Data line switch transistors T28 and T29 can then be turned off by pulling down the DS signal, thus isolating the second data lines from the first data lines. As a consequence, early restoration of the first stage is then allowed and may start at once.

Nodes such as 6, 7 or 21, 22 have relatively small capacitances as compared to those of the bit lines. As a result, discharging relatively small capacitances of these nodes can be done at a much greater rate than the relatively large capacitances of the bit lines. Since the time required to discharge a capacitance with a given current flow is directly related to the size of the capacitance, the small capacitances of these nodes permit valid data to appear on the data output nodes 21 and 22 very rapidly.

As a result, sense amplifier 15 amplifies the differential signal developed across the sensing chain until the data is latched in the second stage.

Cycle performances are greatly improved by use of those data line switch transistors T28 and T29. The specific operation of latch 20 allows output driving very early in the cycle, preventing from waiting for a full swing on nodes 21 and 22.

WRITE cycle

During a WRITE cycle, the word line selection is the same as for a READ cycle. A WRITE signal WR enables writing of an input data "Data In" or DI and $\overline{DI}$ in the first stage when the word line is driven high through WL signal. Latch 5 is set by SSA signal as for a READ operation. Data line switch transistors T28 and T29 are kept off by maintaining the DS signal at a low level and thus no data is transferred to the output circuitry during a WRITE operation. When the BS signal goes high, transistors T6 and T7 are turned on and the data is written in the memory cell. This "half READ" operation improves the WRITE cycle and its sensitivity as the first stage 16 amplifies and locks "Data In" while helping bit line discharge.

General Information

As illustrated in FIG. 4, the present invention can be understood as the result of the action of two successive toboggans caused by the two stages of the disclosed improved sense amplifier depicted in FIG. 2. FIGS. 4A, 4B and 4C respectively show potential variations on the bit lines, the first and second data lines (data output nodes) versus time. As it may be understood from FIG. 4A, which shows the potential variations on the bit lines, in the initial state, the word line signal WL is at a low level. Both bit lines are standing at the VREF potential. The bit switch control signal BS is high (see FIG. 3), transistors T6 and T7, are ready for conduction but still OFF (VGS−VT). A memory cell is selected at t0 by raising the corresponding word line signal WL to VH. The selected cell (e.g. CA), gently pulls down bit lines BLC and BLT in a differential manner with a slope S1. Assuming that its binary content is such as transistor T9A is the conductive transistor, T9A pulls downwards potential of bit line BLC as represented in FIG. 4A. As soon as the differential voltage between BLT and BLC increases, bit switches are driven to conduction and a differential voltage develops between the first data lines DLT and DLC as clear from FIG. 4B. At time t1, the differential voltage between the first data lines has reached an amount considered to be sufficient to set the first stage by raising the SSA control signal to VH (time t1 also corresponds to the differential voltage V1 between the bit lines). The differential voltage between the first data lines DLT and DLC significantly increases, and data line DLC presents a slope S2 more acute than S1. Shortly after time t1, the bit lines are restored using the DLR signal (falling edge). After time t1, data switches T28 and T29 are on the edge of conduction as explained above for T6 and T7, at time t2 they are driven to conduction, and a differential voltage is being developed between the second data lines DC and DT, as seen in FIG. 4C. When the differential voltage which is being developed between the second data lines DT and DC reaches a sufficient value, the second stage is set by raising control signal SL to VH. This is effected at time t3 (which also corresponds to the differential voltage V2 between the first data lines). A short time after time t3, data switches are turned off by pulling control signal DS to GND. At time t4, the first data lines are restored through signal DLR which goes down. As clear from FIG. 4C, the potential of the second data line DC develops very quickly towards the full swing with an increased slope S3.

Therefore, as soon as the first stage has acquired speed amplification, the data is promptly transferred to the second stage. This second sensing device speeds up again the process and amplifies the slope of the falling data line as in a second toboggan. Toboggan action is drastically made clear from comparing the slopes S1, S2 and S3 of curves BLC, DLC and DC. Data out DO is then available shortly after t4 (FIG. 4C). Important rising or falling edges of different control clock signals with their corresponding timings have been reported in FIG. 3.

This double effect toboggan makes feasible both fast access and short cycle time. The major advantages of this architecture are as summarized below:

a large improvement of the access time due to the small differential voltage necessary, for the READ operation;

a reduction of consumed power (same reason as above);

a cycletime improvement, as an operation which follows a READ operation (e.g.: RESTORE, WRITE . . . ) can be started before the end of the READ operation.

It also presents the following additional advantages:

a WRITE operation of the DATA IN on the bit lines can be performed in a faster mode due to the first stage, as the WRITE operation is done with the help of the cross-coupled circuit discharging capacitances C1 and C2, C3 and C4;

a PSEUDO-DUAL PORT operation can be performed due to the line overlap between 2 successive operations: the WRITE operation on the first stage overlapping with the READ operation being processed on the second stage.

The few additional clocks (SL, DS, . . . ) which are necessary to properly operate the circuit of FIG. 2 are simple and are internally generated. Moreover, the cost of the addition of a certain number of devices necessary to implement the second stage is minimal when compared to the advantages obtained by the invention.

The "double toboggan" architecture of the present invention provides excellent performance to the design of SRAMs. Both in read and write cycles, substantial improvements have been achieved such that it is worthwhile to implement the circuit of the present invention in a large variety of SRAM designs. However, the circuit of the present invention is of wide application and may find extensive use in other types of memories such as read only memories. In fact every time a high performance sense amplifier is required, the double stage sense amplifier of the present invention may be used with obvious benefits.

While the present invention has been described with respect to a preferred embodiment, numerous modifications, changes and improvements will occur to those skilled in the art without departing from the spirit and scope of the present invention.

What is claimed is:

1. A sense amplifier for amplifying the difference between first and second signals on respective first and second signal lines, each said first and second signal line having inherent signal line capacitance, said sense amplifier comprising:

first amplifying means responsive to said first and second signals for providing a first differential output signal, including
a first clocked latch, and
first switching means for selectively connecting said first clocked latch to said first and second signal lines;
a second amplifying means responsive to said first differential output signal, including
a second clocked latch, and
second switching means for selecting said first clocked latch from a plurality of first clocked latches and connecting said second clocked latch to said selected first clocked latch; and
means for controlling said first and second amplifying means to sequentially amplify the difference between said first and second signals.

2. The sense amplifier of claim 1 wherein said controlling means includes:
means for sequentially actuating said first and second switching means; and
means for sequentially actuating said first and second clocked latches.

3. The sense amplifier of claim 2 wherein each of said first and second clocked latches comprises:
a first pair of cross-coupled field-effect transistors connected to a first bias potential;
a second pair of cross-coupled field-effect transistors connected to said first pair of cross-coupled field-effect transistors; and
an enabling field-effect transistor connected between said second pair of cross-coupled field effect transistors and a second bias potential.

4. The sense amplifier of claim 3 wherein:
said first switching means includes a pair of field-effect transistors connected between said first clocked latch and said signal lines; and
said second switching means includes a pair of field-effect transistors connected between said second clocked latch and said first clocked latch.

5. The sense amplifier of claim 3 wherein said first amplifying means further includes restore means for selectively raising the outputs of said first clocked latch to a high voltage.

6. The sense amplifier of claim 5 wherein said restore means includes a pair of field-effect transistors connected between said first latch and a bias potential.

7. The sense amplifier of claim 3 wherein said second amplifying means further includes restore means for selectively raising the outputs of said second clocked latch to a high voltage.

8. The sense amplifier of claim 7 wherein said restore means includes a pair of field-effect transistors connected between said first latch and a bias potential.

9. The sense amplifier of claim 3 wherein said second amplifying means further include means for equalizing the signals at the outputs of said second latch.

10. The sense amplifier of claim 3 wherein said first amplifying means further include means for writing data into said first clocked latch.

11. The sense amplifier of claim 1 wherein said first and second clocked latches are each biased between a high and a low power supply.

12. The sense amplifier of claim 1 and further including a signal driver connected to the output of said second clocked latch.

13. The sense amplifier of claim 1 wherein said first and second signal lines comprise first and second bit lines, respectively, connected to a plurality of memory cells.

14. A method for amplifying a difference signal between first and second signal lines, respectively, said first and second signal lines having an inherent signal line capacitance, said method comprising the steps of:
- selecting said first and second signal lines from a plurality of signal lines;
- transferring said difference signal from said selected first and second signal lines to a first clocked latch;
- clocking said first clocked latch when said difference signal has reached a value sufficient such that said difference signal is amplified and stored in said first clocked latch;
- selecting said first clocked latch from a plurality of first clocked latches
- transferring the amplified and stored difference signal from said selected first clocked latch to a second clocked latch; and
- clocking said second clocked latch when the amplified and stored difference signal has reached a value sufficient such that the amplified and stored signal is further amplified and stored in said second clocked latch.

15. A method in accordance with claim 14 wherein each of said transferring steps includes the steps of turning on a pair of transistors.

16. A method in accordance with claim 14 wherein each of said first and second clocked latches comprises:
- a first pair of cross-coupled field-effect transistors connected to a first bias potential;
- a second pair of cross-coupled field-effect transistors connected to said first pair of cross-coupled field-effect transistors; and
- an enabling field-effect transistor connected between said second pair of cross-coupled field effect transistors and a second bias potential.

17. A method in accordance with claim 14 wherein said first and second signal lines comprise bit lines connected to a plurality of memory cells.

* * * * *